United States Patent [19]

Bardell, Jr. et al.

[11] Patent Number: 4,513,418
[45] Date of Patent: Apr. 23, 1985

[54] SIMULTANEOUS SELF-TESTING SYSTEM

[75] Inventors: Paul H. Bardell, Jr., Carmel; William H. McAnney, Fishkill, both of N.Y.

[73] Assignee: International Business Machines Corporation, Armonk, N.Y.

[21] Appl. No.: 440,070

[22] Filed: Nov. 8, 1982

[51] Int. Cl.³ .................... G01R 31/28; G06F 11/00
[52] U.S. Cl. ...................... 371/25; 371/15; 324/73 R
[58] Field of Search ............... 371/25, 15; 324/73 R, 324/73 AT

[56] References Cited

U.S. PATENT DOCUMENTS

| 4,298,980 | 11/1981 | Hajdu et al. ................ 371/25 |
| 4,317,200 | 2/1982 | Wakatsuki et al. ........... 371/25 |
| 4,423,509 | 12/1983 | Feissel ..................... 371/25 |
| 4,435,806 | 3/1984 | Segers et al. ............... 371/25 |

OTHER PUBLICATIONS

D. K. Bhavsar et al., Self-Testing by Polynomial Division, Digest of Papers, 1981 IEEE Intl. Test Conf., pp. 208-216.

P. S. Bottorff et al., Self-Testing Scheme Using Shift Register Latches, IBM Tech. Discl. Bulletin, vol. 25, No. 10, Mar. 1983, pp. 4958-4960.

Primary Examiner—Charles E. Atkinson
Attorney, Agent, or Firm—James E. Murray

[57] ABSTRACT

The LSSD scan paths on a number of logic circuit chips are modified and connected together in series to simultaneously serve as a random signal generator and data compression circuit to perform random stimuli signature generation.

2 Claims, 6 Drawing Figures

FIG. 3
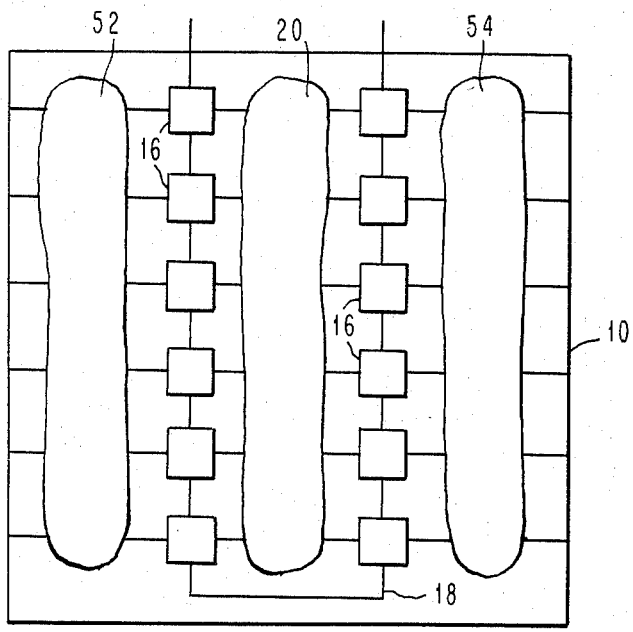
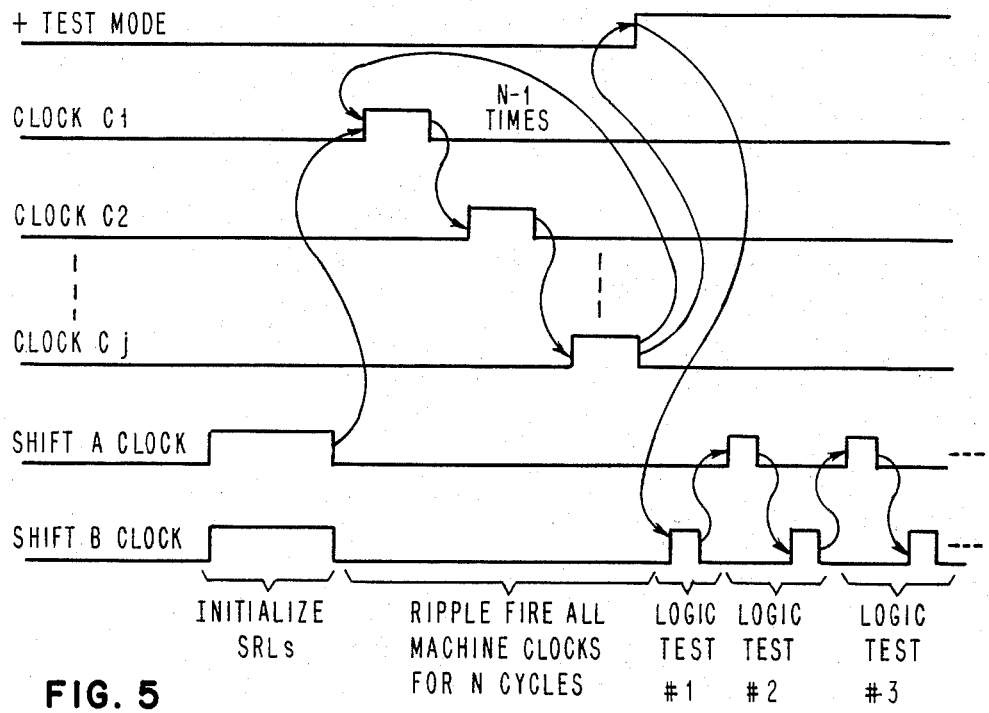
FIG. 5

SIMULTANEOUS SELF-TESTING SYSTEM

BACKGROUND OF THE INVENTION

The present invention relates to testing of complex combinatorial and sequential logic circuits embodied in large scale integration (LSI) and very large scale integration (VLSI) circuit devices.

A fault occurring anywhere in such a LSI or VLSI circuit device can have its effect propagated through a number of feedback loops formed of storage or memory elements in the sequential logic before reaching a testable output of the device. Level sensitive scan design (LSSD) rules were devised to eliminate the complications in testing caused by this propagation through the feedback loops. As described by E. B. Eichelberger and T. W. Williams in an article entitled "A Logic Design Structure for LSI Testability" on pages 462–468 of the Proceedings of the 14th Design Automation Conf., LSSD rules impose a clocked structure on the memory elements of logic circuits and require these memory elements be tied together to form a shift register scan path so that the memory elements are all accessible for use as both a test input or output point. Therefore, with the scan path, test input signals can be introduced or test results observed wherever one of the memory elements occurs in the logic circuit. Being able to enter the logic circuit at any memory element for introducing test signals or observing test results, allows the combinational and sequential logic to be treated as much simpler combinational logic for testing purposes thus considerably simplifying test generation and analysis.

Single or multiple scan paths can be provided under the LSSD rules. It has been suggested in an article by R. A. Feretich appearing on page 5414 of the May 1980 issue of the IBM Technical Disclosure Bulletin that control means can be provided for LSSD scan circuits to switch between single or multiple path modes of operation.

In using LSSD, a single stuck-fault model is used to generate the test patterns applied to the circuit, and output responses are collected after each test for comparison with the precalculated "good circuit" responses. It has been shown that such stuck-fault test generation is one of a class of difficult mathematical problems called NP-complete, where NP stands for non-deterministic polynomial time and complete meaning that a solution for one problem in the class could be extended to all. In all NP-complete problems the number of possible solutions grows spectacularly as the size of the problem increases. Therefore, the implication is that test generation computer times increase exponentially with the size of the circuit. In view of this, it appears that the best stuck fault test algorithms are only computationally feasible for fairly small or fairly simple networks and fault-oriented approaches become prohibitively expensive with the increasing circuit density of VLSI chips and modules.

It has been previously suggested that self-testing be employed in connection with LSSD to reduce the time it takes to generate the test patterns and to perform the testing. Self-testing involves the use of pseudo-random pattern generators and response compression structures that are built into logic circuit devices. Using such pattern generators and compression structures eliminates the computer time needed to generate the tests while placing these testing elements on the device containing the logic allows the application of vast numbers of test patterns to the circuits in a reasonable period of time. Potential compression methods for use during these testings include transition counting, as suggested by J. P. Hayes in an article entitled "Testing Logic Circuits by Transition Counting", FTCS-5, pages 215–219, June 1975, and more recently, signature analysis, as described by R. A. Frohwerk in "Signature Analysis: A New Digital Field Service Method", Hewlett-Packard Journal, Vol. 28, pages 2–8, May 1977.

Konemann, Mucha, and Zwiehoff describe incorporating the structure necessary to perform random stimuli signature analysis into the circuit device being tested in their papers "Built-in Logic Block Observation Techniques", 1979 IEEE Test Conf., pages 37–41, Cherry Hill, N.J., October 1979 and "Built-in Test for Complex Digital Integrated Circuits", IEEE J. Solid-State C., Vol. SC-15, No. 3, pages 315–319, June 1980. In the Konemann et al articles a shift register scan path is reconfigured to form a serially connected linear feedback shift register (LSFR) circuit that operates either as a random input signal generator or as a data compression circuit to perform self-test signature analysis. One of the circuits operates as an input signal generator while another of these circuits operates as an output response compressor. During a later test their roles may be reversed. However, at no point does either LFSR circuit simultaneously perform both the input and output functions during the self-test.

In co-pending U.S. patent application Ser. No. 440,065 filed on even date herewith and entitled "Parallel Signature Generation Circuits", a plurality of LSSD scan paths are connected in parallel between different stages of a pseudo-random source and data compression circuit.

THE INVENTION

In accordance with the present invention a new configuration is provided to perform self-testing in circuits designed with LSSD rules. In this new configuration, the shift register latches (SRL) in the LSSD scan paths simultaneously perform both the input signal generation and output data compression functions. The scan path is first initialized by loading in a repeatable data pattern. Thereafter the scan path is reconfigured into a single linear feedback shift register (LFSR) that simultaneously performs both test pattern generation and response data compression functions. Alternate scan path shift cycles are applied to the SRLs exercising the combinational logic with the contents of the SRLs and capturing the results of the response back into the SRLs where they are used as the test inputs for the next cycle. At the end of the requisite number of cycles the contents of the scan path is read out as the signature to be compared with the desired value.

Therefore, it is an object of the present invention to provide a new circuit configuration for performing self-testing.

It is another object of the invention to provide signature analysis using LSSD design rules and circuits.

It is another object of the invention to provide a high speed self-testing configuration which performs one test for each cycle of the scan clocks.

It is a further object of the invention to simplify the performance of self-test signature analysis.

THE DRAWINGS

These and other objects of the invention are best understood by reference to the accompanying figures illustrating the embodiment of the invention of which:

FIG. 3 is a schematic of a circuit chip containing a scan path of LSSD shift register latches;

FIG. 5 is a signal timing diagram of the data compression device of FIG. 4;

ILLUSTRATED EMBODIMENT

Figure 1:
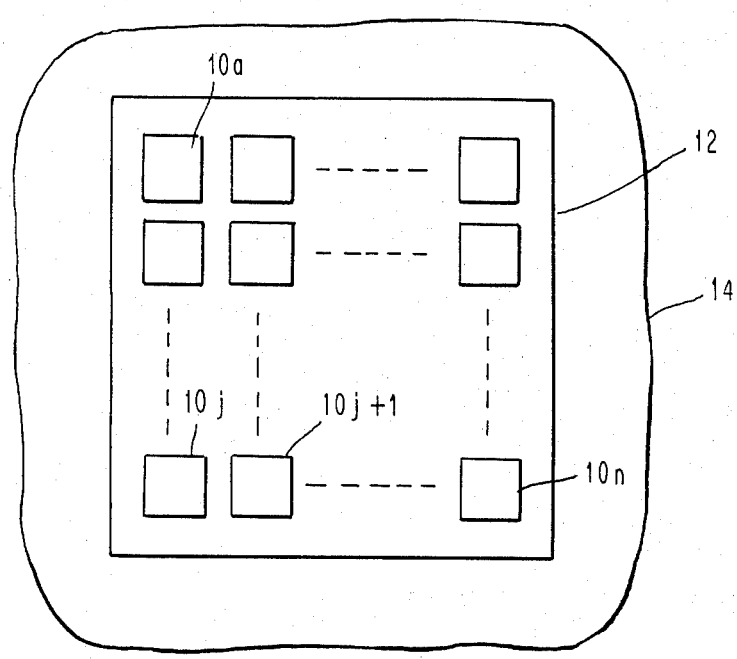
FIG. 1 is a plan view of a circuit module.

In FIG. 1, a plurality of semiconductor logic circuit chips 10 are arranged on the topside of a substrate 12 of a module and interconnected by wiring nets within the substrate 12 to perform logic functions. The underside of the substrate 12 contains connecting pins which plug into a circuit board 14 which holds a plurality of such substrates 12 interconnected by circuitry within the board 14.

Figure 2:
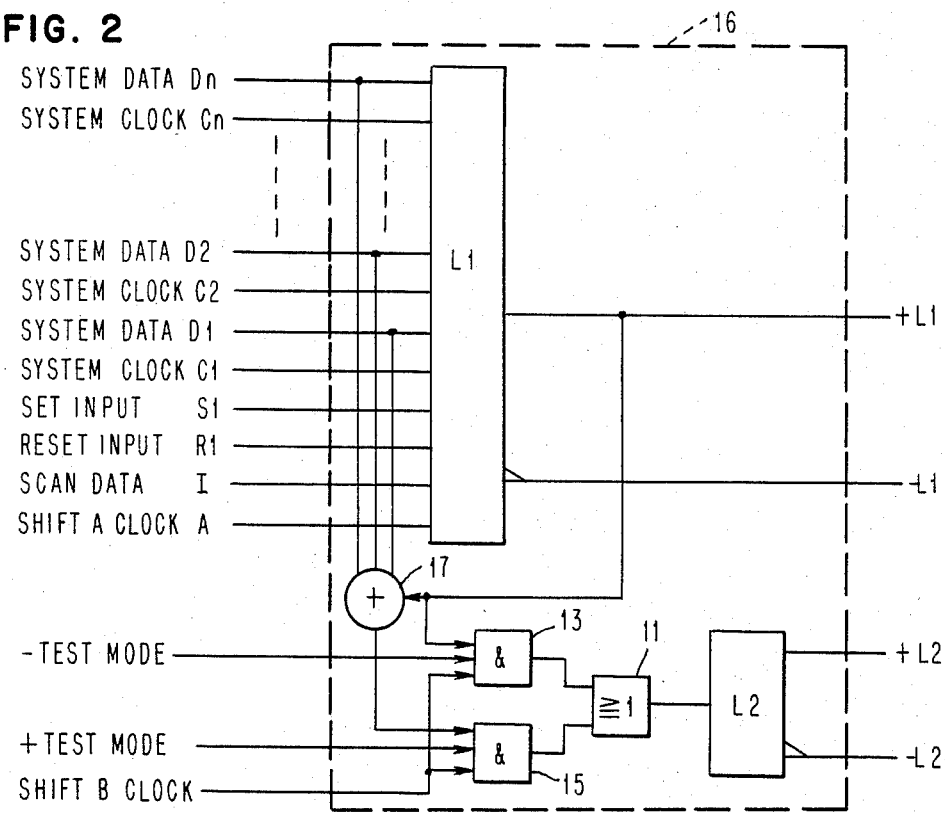
FIG. 2 is a circuit diagram of a LSSD shift latch used in the present invention.

The memory elements or circuits on the circuit chips are all shift register latches (SRLs). As shown in FIG. 2, an SRL contains two latches: a data input latch (L1) and a second latch (L2) for use in system or shift register operation.

Latch L1 is fed by one or more system clocks ($\pm C$), polarity hold data inputs ($\pm D$), set inputs ($\pm S$), reset inputs ($\pm R$), scan data inputs ($\pm I$) and shift-A clock inputs ($\pm A$). Latch L2 is fed only by the output of OR circuit 11. The OR circuit 11 receives the output of AND circuits 13 and 15 which act as gates responsive to whether the +Test Mode signal is up or down. When the +Test Mode signal is down the output of latch L1 is fed through AND gate 13 to latch L2 concurrent with the shift B clock. When the +Test Mode signal is up the output of an exclusive OR circuit 17 is fed through AND gate 15 concurrently with the shift B clock. The output of the Exclusive OR circuit 17 is the exclusive OR of the system data inputs D1 to Dn to the L1 latch and the +L1 output of the L1 latch.

System data outputs may be taken from latch L1 ($\pm L1$), from latch L2 ($\pm L2$) or from both latch L1 and latch L2. At least one output (+L2) from latch L2 must be used to provide a shift register data or scan path for testing purposes. All SRLs on a logic circuit chip 10 of FIG. 1 are connected together in a single scan path.

The system clocks $\pm C_i$ control the corresponding system data inputs ($\pm D_i$, $\pm S_i$, $\pm R_i$, $\pm \text{Extend}_i$) such that when each system clock is in its "off" state, none of these data inputs can affect the data stored in latch L1. When a system clock is "on" and the other system clocks and the shift-A clock are "off", the corresponding system data inputs determine the state of latch L1.

When the shift-A clock is "on" and the system clocks are "off", the scan data input ($\pm I$) will determine the state of latch L1.

When the shift-B clock is "on", latch 2 will assume the data stored in latch L1 or the output of the exclusive OR circuit depending on whether the +Test Mode signal is down or up.

When the shift-A clock is "on", the shift-B clock is "on", the +Test Mode input is down and the system clocks, $C_i$, are "off", then the L1 and L2 latches will follow the value of the scan data input(s) ($\pm I$).

The control lines marked +Test Mode and —Test Mode are inverses of each other. When the circuit is not in test mode (with +Test Mode at a logical 0 and —Test Mode at a logical 1), the SRL functions normally as a system latch using the System Clock and System Data inputs, or as a shift register element using the Scan Data input and the shift-A and shift-B clocks.

Figure 4:
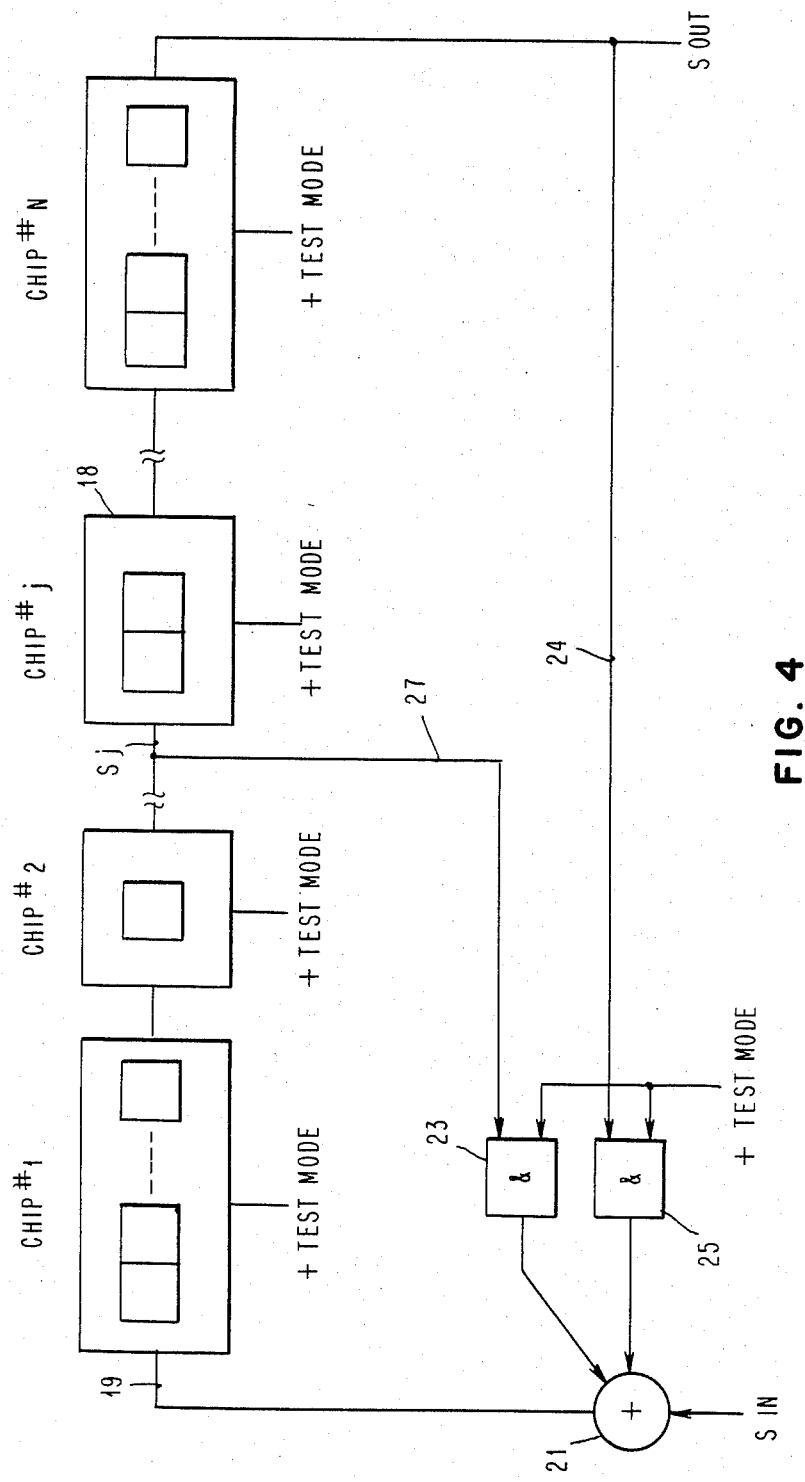
FIG. 4 is a block diagram of the arrangement of scan paths of FIG. 3 in accordance with the present invention.

In test mode, the +Test Mode input is at a logical 1 and the —Test mode input is at a logical 0. During test mode, only the shift-A and shift-B clocks are used. The System Clocks are always at a logical 0 or "off". The L1 latch acts as a one bit storage element, accepting data from the preceding SRL in the signature register via the Scan Data input when the Shift A clock is "on". When Shift B clock is "on" (and Shift A clock is off since the two clocks are non-overlapping), the Exclusive OR, XOR, of the scan path data +L1 and the System data D1 to Dn is gated into the L2 latch. A string of such modified SRLs with appropriate feedback circuitry as shown in FIG. 4 will form a multiple-input signature register as shown in the article by B. Konemann, J. Mucha and G. Zwiehoff, entitled "Built-In Logic Block Observation Techniques", appearing in the Digest of Papers, for the 1979 IEEE Test Conference, Cherry Hill, N.J., on pages 37-41, without the added primary system path delay therein. The signature at test completion is available at the L2 latch outputs.

Logic circuits on the chips 10 are designed using LSSD rules or constraints. Thus, as shown in FIG. 3 all the SRLs 16 on a chip form a shift register scan path 18 with an input and output independent of the logic function inputs and outputs on the chip so that data can be entered and moved from the latches 16 through this path independently of data inputs and outputs. Furthermore, the SLRs 16 are separated from each other by combinatorial logic circuits 20. As pointed out above, this arrangement of separate scan paths for testing and separation of latches 16 allows complex sequential and combinatorial logic circuits to be analyzed as simpler combinatorial logic circuits 20 with latch circuit inputs and outputs.

As shown in FIG. 4 all the chips on a module are connected in a single scan path with a module input Sin and a module output Sout. For self-test purposes this scan path includes an exclusive OR circuit 21 which performs an exclusive OR of the input Sin to the scan path 19 with the output Sout of the scan path 24 and a signal SJ27 at one or more intermediate points on the scan path 19. The signal points Si should be chosen so that the feedback function created by the Si and Sout through the exclusive OR 21 implements a primitive polynomial as descirbed in an article by F. J. MacWilliams and N. J. A. Sloane, entitled "Pseudo-random Sequences and Arrays", which appeared in the Proceedings of the IEEE, pages 1715-1729, Vol. 64, No. 12, December 1976. When the module is not in test mode AND gates 23 and 25 decouple the feedback paths 27 and 29 from their respective inputs to the exclusive OR circuit 21 so that no exclusive OR function is performed by exclusive OR gate 21. As explained earlier, the absence of the same test mode signal deactivates the exclusive OR function in each of the SLRs 16 so that no exclusive OR function is performed along the scan path either by exclusive OR gate 21 or the exclusive OR gate 17 in the individual latches 16. Therefore, the scan path operates as a prior art LSSD scan path. However, when the test mode signal is up, AND gates 23 and 25 insert the exclusive OR function into the scan path at the input with exclusive OR gate 21 and in each of the stages with AND gates 15 so that the scan path 19 functions as a linear feedback shift register (LFSR) capable of performing both the random signal generation and compression functions necessary for signature analysis.

When every SRL 16 on the module is a self-test SRL as shown in FIG. 2, testing is accomplished by alternately pulsing the Shift A and Shift B clocks, The shift A clock changes the logic stimuli (in a single latch design) by gating into the L1 latch the contents of the previous L2 latch in the string. The Shift B clock captures the logic responses (on the System Data lines) through the XOR 17. Thus the test mode SRL collects test results from the logic driving its System Data ports and simultaneously supplies test values (through the +L1 and −L1 outputs) to the downstream logic.

A self-test sequence will now be described. Referring to the test sequence timing diagram for Simultaneous Self-Test in FIG. 5:

1. With the +Test Mode signal down, set all SRLs 16 to a known state using a Flush operation. In this operation, the shift clocks, A and B, are held on while the system clocks are held off. The logical value on the scan-in primary input (Sin of FIG. 4) is flushed through the shift register string setting all SRLs to a known (and repeatable) state.

2. Sequentially, stimulate each of the machine clocks for N cycles (N is on the order of 10). The purpose of this step is to test the system Data and System Clock inputs to each L1 latch. Stimulating the first system clock, C1, captures the logical values on the System Data ports of those SRLs driven by clock C1. The changed L1 latch values of those SRLs are propagated through the logic to other System Data ports to be captured in turn when their appropriate system clock is stimulated. This process is continued for N cycles, testing most, if not all, of the System Data and System Clock ports. At the end of the N cycles, the L1 latches of the module are in a known and repeatable stage.

3. Raise the +Test Mode primary input (PI), converting all SRLs into self-test SRLs and arranging them in the LFSR configuration shown in FIG. 4. Note that this action does not disturb the contents of the L1 latches.

4. Toggle the Shift A and Shift B clocks, starting with shift clock B, for a preset number of cycles.

5. Compare the test signature, available in the L2 latches after the last shift B clock pulse, to the expected signature for a Go/No Go test indication.

The described arrangement provides protection against a type of error-masking common to multiple-input signature registers. Such masking occurs when an error appearing on logic output i at test cycle j is cancelled (in the signature register) by an error on output i+1 at cycle J+1. Here, the error on output i is captured in the L2 latch at the next shift B clock. At the following shift A clock, the error is transferred to the succeeding L1 latch and immediately propagates through the logic driven by that latch, to be captured in possibly many downstream latches at the next shift B clock time. The error is thus multiplied across the SRL boundary and cannot be cancelled by a simple correlated error.

In the chip shown in FIG. 3, the latches 16 in the scan path 18 are used to test the combination of logic circuits 20 that are bounded by SRLs 16 so that inputs supplied from one SRL affect outputs taken from another or other SRLs. Circuits 52 and 54 that either have no SRL inputs or SRL outputs on the chip receive such SRL inputs or outputs from other chips on the substrate. However, when this analysis is extended to the substrate 12, certain portions of the circuitry on the substrate have no test circuitry coverage.

Figure 6:
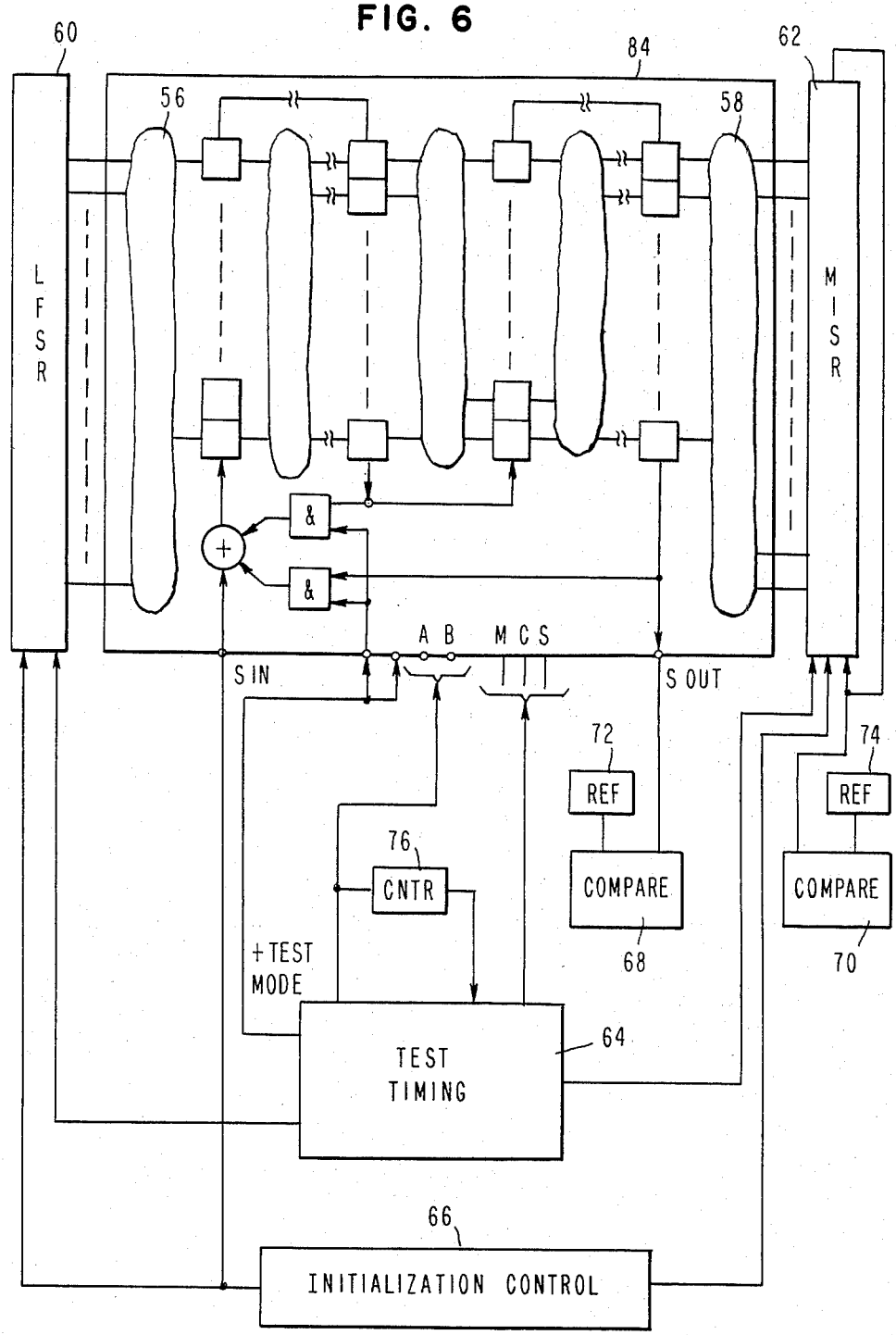
FIG. 6 is a schematic of a tester fixture employed with the present invention.

As shown in FIG. 6 portions 56 and 58 of the circuitry on the module is not fully covered by the SRLs 16 on the module. For this reason a testing socket is provided for the module which includes circuits to give complete coverage to the module when it is tested outside a system environment.

The primary input pins of the module are driven by an additional pseudo-random binary number generator 60 (a linear feedback shift register or LFSR) and test responses from circuits 58 are compressed by an additional multiple input signature register MISR 62.

The LFSR 60 feeds random test signals to the module 11 inputs and the MISR 62 compresses responses from the module outputs. The test socket also includes a timing signal generator 64 to run the machine clocks (MCs), the shift clocks AB, the clocks for the LFSR 60 and the MISR 62 and to control the +Test Mode input to the module. Also controls 66 are provided to initialize the MISR 62, the LFSR 60, and the SRLs 16. Finally, comparison means 68 and 70 are provided to make separate comparisons between the outputs of MISRs 24 and 62 and the stored values 72 and 74 representing the signatures of a good module.

The number of test patterns performed and analyzed in this manner must be precisely controlled to guarantee repeatability. One way is to build a counter 76 into the test socket electronics and to stop the test when the counter registers a predetermined number of AB cycles.

Comparison of the signature remaining in the MISR after the last scan operation with the predetermined expected signature can be done off-module using the MISR scan capability to unload the final signature into the comparator 68 as described or can be done on-module using an AND gate driven by the individual SRLs 16.

Above we have described testing of the circuit module when it is outside the system environment. In the system environment the functions performed by the circuits associated with the module socket can be performed by the system.

Therefore it should be understood that many modifications and changes can be made in the illustrated embodiment without departing from the spirit and scope of the invention as represented in the attached claims.

We claim:

1. In a combinational and sequential logic circuit with memory circuits on individual logic units coupled together to form a shift register scan path for testing logic circuits and uncoupled to disable the scan path while the logic circuit is performing its designed logic function, a method for performing self-testing using a multistage generator means to generate testing sequences for the self-testing and multistage data compression means to compress the responses of the logic circuits comprising:

(a) forming the shift register scan path on the logic unit into a single linear feedback shift register means capable of forming multistage random signal generator means for a multistage data compression means, (b) shifting data through said linear feedback shift register means to transmit the data as a test input from memory circuits of said linear feedback shift register means and simultaneously capture the response to the shifted data in the same memory circuits of said linear feedback shift register means;

(c) using the captured response to the shifted data as a further test input transmitted from said memory circuits of said linear feedback shift register means and capturing the response to said further test input in the same memory circuits;

(d) repeat step (c) n times;

(e) reading the contents of said linear feedback means out of said scan path after step (d) as the test result.

2. In a combinational and sequential logic circuit with memory circuits on individual logic units coupled together to form a shift register scan path for testing logic circuits and uncoupled to disable the scan path while the logic circuit is performing its designed logic function, a method for performing self-testing using a multistage generator means to generate testing sequences for the self-testing and a multistage data compression means to compress the responses of the logic circuits the improvement comprising:

(a) first using the scan path to introduce a preset data pattern into the memory circuits of the scan path;

(b) changing the stages of the shift register scan path into a linear feedback shift register means capable of function as a multistage random signal generator means and a multistage data compression means, after the preset data pattern has been introduced into the memory circuits;

(c) shifting data through said linear feedback shift register means so that it simultaneously supplies a test output and captures response of the logic circuit to the test input;

(d) using the captured response to the shifted data as a further test input transmitted from said memory circuits of said linear feedback shift register means and capturing the response to said further test input in the same memory circuits;

(e) repeat step d n times;

(f) reading the contents of said linear feedback shift register means as the test result after a plurality of shifting cycles as recited in step (d) have been performed by the linear feedback shift register means.

* * * * *